United States Patent
Killen et al.

(10) Patent No.: US 6,737,932 B2
(45) Date of Patent: May 18, 2004

(54) BROADBAND IMPEDANCE TRANSFORMERS

(75) Inventors: William D. Killen, Melbourne, FL (US); Randy T. Pike, Grant, FL (US)

(73) Assignee: Harris Corporation, Melbourne, FL (US)

(*) Notice: Subject to any disclaimer, the term of this patent is extended or adjusted under 35 U.S.C. 154(b) by 0 days.

(21) Appl. No.: 10/185,847

(22) Filed: Jun. 27, 2002

(65) Prior Publication Data

US 2004/0000963 A1 Jan. 1, 2004

(51) Int. Cl.⁷ .................................................. H03H 7/38
(52) U.S. Cl. ........................... 333/35; 333/124; 333/32
(58) Field of Search .......................... 333/32–35, 177, 333/124

(56) References Cited

U.S. PATENT DOCUMENTS

| | | |
|---|---|---|
| 3,419,813 A | 12/1968 | Kamnitsis |
| 3,571,722 A | 3/1971 | Vendelin |
| 3,678,418 A | 7/1972 | Woodward |
| 4,495,505 A | 1/1985 | Shields |
| 4,525,720 A | 6/1985 | Corzine et al. |
| 4,800,344 A | 1/1989 | Graham |
| 4,825,220 A | 4/1989 | Edward et al. |
| 4,882,553 A | 11/1989 | Davies et al. |
| 4,916,410 A | 4/1990 | Littlefield |
| 4,924,236 A | 5/1990 | Schuss et al. |
| 5,039,891 A | 8/1991 | Wen et al. |
| 5,148,130 A | 9/1992 | Dietrich |
| 5,379,006 A | 1/1995 | McCorkle |
| 5,455,545 A | 10/1995 | Garcia |
| 5,523,728 A | 6/1996 | McCorkle |
| 5,678,219 A | 10/1997 | Agarwal et al. |
| 6,052,039 A | 4/2000 | Chiou et al. |
| 6,114,940 A | 9/2000 | Kakinuma et al. |
| 6,133,806 A | 10/2000 | Sheen |
| 6,137,376 A | 10/2000 | Imbornone et al. |
| 6,184,845 B1 | 2/2001 | Leisten et al. |
| 6,307,509 B1 | 10/2001 | Krantz |

FOREIGN PATENT DOCUMENTS

| | | |
|---|---|---|
| EP | 0728716 | 8/1996 |
| JP | 06291519 | 10/1994 |
| JP | 07046010 | 2/1995 |
| JP | 07283619 | 10/1995 |
| WO | WO 0101453 | 1/2001 |

OTHER PUBLICATIONS

U.S. patent application Ser. No. 10/448,973, Delgado et al., filed May 30, 2003.
U.S. patent application Ser. No. 10/184,277, Killen et al., filed Jun. 27, 2002.
U.S. patent application Ser. No. 10/185,443, Killen et al., filed Jun. 27, 2002.
U.S. patent application Ser. No. 10/184,332, Killen et al., filed Jun. 27, 2002.
U.S. patent application Ser. No. 10/185,251, Parsche et al., filed Jun. 27, 2002.
U.S. patent application Ser. No. 10/185,275, Killen et al., filed Jun. 27, 2002.
U.S. patent application Ser. No. 10/185,273, Killen et al., filed Jun. 27, 2002.
U.S. patent application Ser. No. 10/308,500, Killen et al., filed Dec. 3, 2002.
U.S. patent application Ser. No. 10/373,935, Killen et al., filed Feb. 25, 2003.

(List continued on next page.)

*Primary Examiner*—Don Le
(74) *Attorney, Agent, or Firm*—Sacco & Associates, PA (57) ABSTRACT

The invention concerns an impedance transforming device that includes a dielectric circuit board substrate. The substrate has at least one region that has a relative permeability or a relative permittivity different from a remaining portion of the substrate. In order to control the permeability and permittivity, in this way, meta-materials can be used to selectively modify portions of the substrate. A transmission line transformer is disposed on the substrate and coupled to the region.

17 Claims, 7 Drawing Sheets

OTHER PUBLICATIONS

U.S patent application Ser. No. 10/404,285, Killen et al., filed Mar. 31, 2003.

U.S. patent application Ser. No. 10/404,981, Killen et al., filed Mar. 31, 2003.

U.S. patent application Ser. No. 10/404,960, Killen et al., filed Mar. 31, 2003.

U.S. patent application Ser. No. 10/185,144, Killen et al., filed Jun. 27, 2002.

U.S. patent application Ser. No. 10/185,266, Killen et al., filed Jun. 27, 2002.

U.S patent application Ser. No. 10/185,162, Rumpf, Jr., et al., filed Jun. 27, 2002.

U.S. patent application Ser. No. 10/185,824, Killen et al., filed Jun. 27, 2002.

U.S patent application Ser. No. 10/185,187, Killen et al., filed Jun. 27, 2002.

U.S. patent application Ser. No. 10/185,855, Killen et al., filed Jun. 27, 2002.

U.S. patent application Ser. No. 10/185,459, Killen et al., filed Jun. 27, 2002.

U.S. patent application Ser. No. 10/185,480, Killen et al., filed Jun. 27, 2002.

U.S. patent application Ser. No. 10/439,094, Delgado et al., filed May 15, 2003.

BROADBAND IMPEDANCE TRANSFORMERS

BACKGROUND OF THE INVENTION

1. Statement of the Technical Field

The inventive arrangements relate generally to methods and apparatus for providing increased design flexibility for RF circuits, and more particularly for optimization of dielectric circuit board materials for improved performance.

2. Description of the Related Art

RF circuits, transmission lines and antenna elements are commonly manufactured on specially designed substrate boards. For the purposes of these types of circuits, it is important to maintain careful control over impedance characteristics. If the impedance of different parts of the circuit do not match, this can result in inefficient power transfer, unnecessary heating of components, and other problems. Electrical length of transmission lines and radiators in these circuits can also be a critical design factor.

Two critical factors affecting the performance of a substrate material are dielectric constant (sometimes called the relative permittivity or $\in_r$) and the loss tangent (sometimes referred to as the dissipation factor). The relative permittivity determines the speed of the signal in the substrate material, and therefore the electrical length of transmission lines and other components implemented on the substrate. The loss tangent characterizes the amount of loss that occurs for signals traversing the substrate material. Accordingly, low loss materials become even more important with increasing frequency, particularly when designing receiver front ends and low noise amplifier circuits.

Printed transmission lines, passive circuits and radiating elements used in RF circuits are typically formed in one of three ways. One configuration known as microstrip, places the signal line on a board surface and provides a second conductive layer, commonly referred to as a ground plane. A second type of configuration known as buried microstrip is similar except that the signal line is covered with a dielectric substrate material. In a third configuration known as stripline, the signal line is sandwiched between two electrically conductive (ground) planes. Ignoring loss, the characteristic impedance of a transmission line, such as stripline or microstrip, is equal to $\sqrt{L_l/C_l}$ where $L_l$ is the inductance per unit length and $C_l$ is the capacitance per unit length. The values of $L_l$ and $C_l$ are generally determined by the physical geometry and spacing of the line structure as well as the permittivity of the dielectric material(s) used to separate the transmission line structures. Conventional substrate materials typically have a permeability of approximately 1.0.

In conventional RF design, a substrate material is selected that has a relative permittivity value suitable for the design. Once the substrate material is selected, the line characteristic impedance value is exclusively adjusted by controlling the line geometry and physical structure.

One problem encountered when designing microelectronic RF circuitry is the selection of a dielectric board substrate material that is optimized for all of the various passive components, radiating elements and transmission line circuits to be formed on the board. In particular, the geometry of certain circuit elements may be physically large or miniaturized due to the unique electrical or impedance characteristics required for such elements. For example, many circuit elements or tuned circuits may need to be an electrical ¼ wave. Similarly, the line widths required for exceptionally high or low characteristic impedance values can, in many instances, be too narrow or too wide for practical implementation for a given substrate. Since the physical size of the microstrip or stripline is inversely related to the relative permittivity of the dielectric material, the dimensions of a transmission line can be affected greatly by the choice of substrate board material.

From the foregoing, it can be seen that the constraints of a circuit board substrate having selected relative dielectric properties often results in design compromises that can negatively affect the electrical performance and/or physical characteristics of the overall circuit. An inherent problem with the conventional approach is that, at least with respect to conventional circuit board substrate, the only control variable for line impedance is the relative permittivity. This limitation highlights an important problem with conventional substrate materials, i.e. they fail to take advantage of the other factor that determines characteristic impedance, namely $L_l$, the inductance per unit length of the transmission line.

Figure 1:
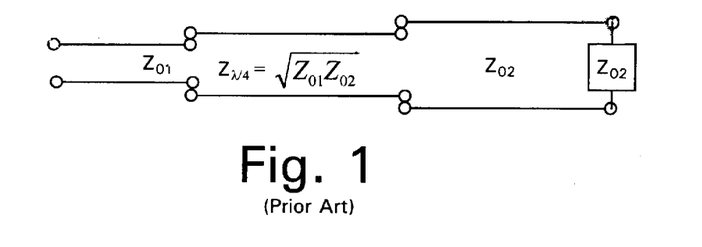
FIG. 1 is a schematic representation of a conventional quarter-wave impedance transformer.

A quarter-wavelength section of line can be designed to provide a match between a desired transmission line impedance and a given load. For example, in the circuit shown in FIG. 1, a transmission line can be matched to a load at the termination of the quarter-wave section if the characteristic impedance of the quarter wave section $$Z_{\frac{\lambda}{4}}$$

is selected using the equation:

$$Z_{\frac{\lambda}{4}} = \sqrt{Z_{01}Z_{02}}$$

where $Z_{\frac{\lambda}{4}}$ is the characteristic impedance of the quarter-wave section;

$Z_{01}$ is the characteristic impedance of the input transmission line; and $Z_{02}$ is the load impedance.

Simple quarter-wave transformers will operate most effectively only over a relatively narrow bandwidth where the length of the transformer approximates a quarter-wavelength at the frequency of interest. In order to provide matching over a broader range of frequencies, a multi-section transformer can be designed with a large number of matching stages. For example, rather than attempting to use a single quarter-wave transmission line to transform from an impedance of 50 ohms to 10 ohms, one could use two quarter-wave sections in series. In that case, the first quarter wave section might be designed to transform from 50 ohms to 30 ohms, and the second quarter wave section might transform from 30 ohms to 10 ohms. Notably, the two quarter-wave sections when arranged in series would together comprise a half-wave section. However, this half wave section would advantageously function as a quarter-wave transformer section at half the design frequency. This technique can be used to achieve matching that is more broad-banded as compared to a simple quarter-wavelength section.

Figure 2:
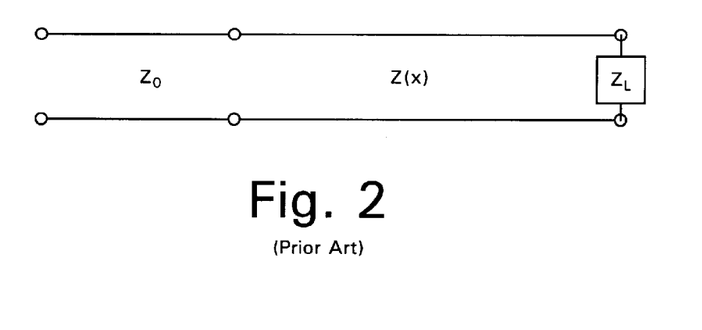
FIG. 2 is a schematic representation of a conventional tapered line transformer.

As the number of transformer stages is increased, the impedance change between sections becomes smaller. In fact, a transformer can be designed with essentially an infinite number of stages such that the result is a smooth, continuous variation in impedance represented in FIG. 2 as $Z(x)$ between feed line $Z_0$ and load $Z_L$. In FIG. 2, x is the distance along the matching section. For maximally wide pass band response and a specified pass band ripple the taper profile has an analytic form known as the Klopfenstein taper. There is a substantial literature devoted to the design of multiple section and tapered transmission line transformers.

One problem with multiple transformer sections and tapered line transformers is that they are physically large structures. In fact, multiple section transformers are generally multi-quarter wavelengths long at the design frequency and tapered line transformers are generally at least about one wave-length long at the lowest design frequency and the minimum length is, to a degree, dependent on the impedance ratio. Accordingly, these designs are in many cases not compatible with the trend toward application of miniature semiconductors and integrated circuits.

Yet another problem with transmission line impedance transformers is the practical difficulties in implementation in microstrip or stripline constructions. For example, for a given dielectric substrate having a predetermined permittivity, the characteristic impedance of a transmission line is generally a function of the line width. Consequently, the width of the transformer section can become impractically narrow or wide depending on the transformation that a designer is trying to achieve, i.e., the impedance at each end of the transformer section.

SUMMARY OF THE INVENTION

The invention concerns an impedance transforming device that includes a dielectric circuit board substrate. The substrate has at least one region that has a relative permeability or a relative permittivity different from a remaining portion of the substrate. In order to control the permeability and permittivity, in this way, meta-materials can be used to selectively modify portions of the substrate. A transmission line transformer is disposed on the substrate and coupled to the one region. According to one aspect of the invention, the transmission line transformer can be configured for matching an input circuit of the transformer to an output circuit of the transformer. For example, the transmission line transformer can be a multiple of a quarter-wavelength at a predetermined operating frequency of the device. The transmission line transformer can be a microstrip construction, a stripline construction or a twin-line construction. Alternatively, at least a portion of the transmission line transformer can be constructed in a stacked configuration.

According to another aspect of the invention, the device can include a plurality of regions as described above. In that case, each region can have the relative permeability or the relative permittivity different from remaining ones of the regions. Further, the transmission line transformer can be comprised of a plurality of segments, each one coupled to at least one of the regions. The permittivity and the permeability of the region or regions can be varied within the region along a length of the transmission line transformer. Using this technique, the characteristic impedance of the transmission line transformer can be varied along its length in accordance with a tapered line type transformer to achieve, broadly, a function of impedance transformation versus length.

DETAILED DESCRIPTION OF THE PREFERRED EMBODIMENTS

Low dielectric constant board materials are ordinarily selected for RF designs. For example, polytetrafluoroethylene (PTFE) based composites such as RT/duroid® 6002 (dielectric constant of 2.94; loss tangent of 0.009) and RT/duroid® 5880 (dielectric constant of 2.2; loss tangent of 0.0007) are both available from Rogers Microwave Products, Advanced Circuit Materials Division, 100 S. Roosevelt Ave, Chandler, Ariz. 85226. Both of these materials are common board material choices. The above board materials provide dielectric layers having relatively low dielectric constants with accompanying low loss tangents.

However, use of conventional board materials can compromise the miniaturization of circuit elements, such as transformer sections, and may also compromise some performance aspects of circuits that can benefit from high dielectric constant layers. A typical tradeoff in a communications circuit is between the physical size of antenna elements versus efficiency. By comparison, the present invention provides the circuit designer with an added level of flexibility by permitting use of a dielectric layer portion with selectively controlled permittivity and permeability properties optimized for efficiency and size. This added flexibility enables improved performance and antenna element density not otherwise possible.

Figure 3:
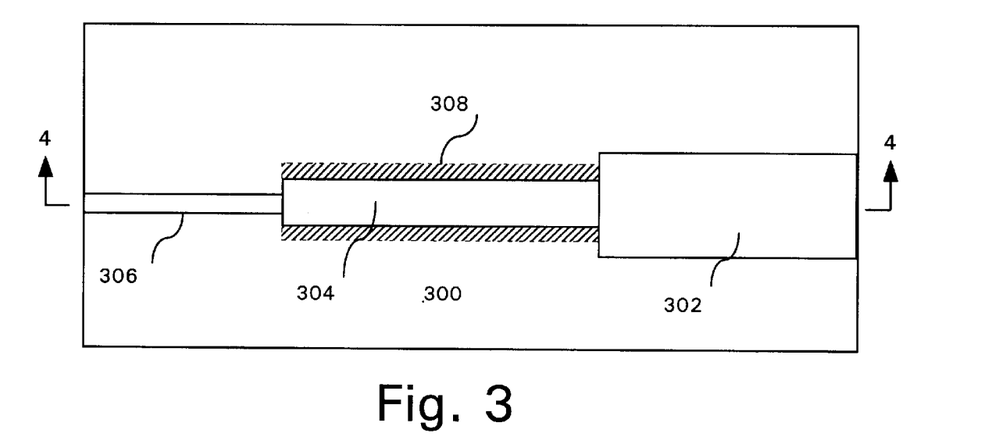
FIG. 3 is a top view of an impedance transformer that is useful for understanding the invention.
Figure 4:
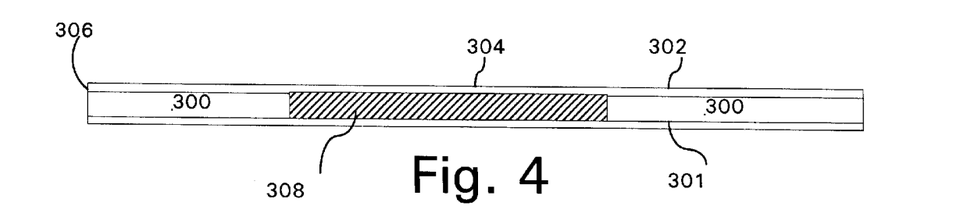
FIG. 4 is a cross-sectional view of FIG. 3 taken along line 4—4.

FIGS. 3 and 4 show a microstrip implementation of a quarter-wave transformer section 304 on a substrate 300. A ground plane 301 is provided beneath the substrate as shown. Substrate region 308 that is beneath the transformer section 304 has substrate characteristics that are different from the remainder of the substrate 300 that is coupled to the input and output transmission line sections 302, 306 respectively. For example, the permittivity in region 304 can be selectively increased so as to reduce the physical length of the quarter-wave transformer section 304.

Figure 5:
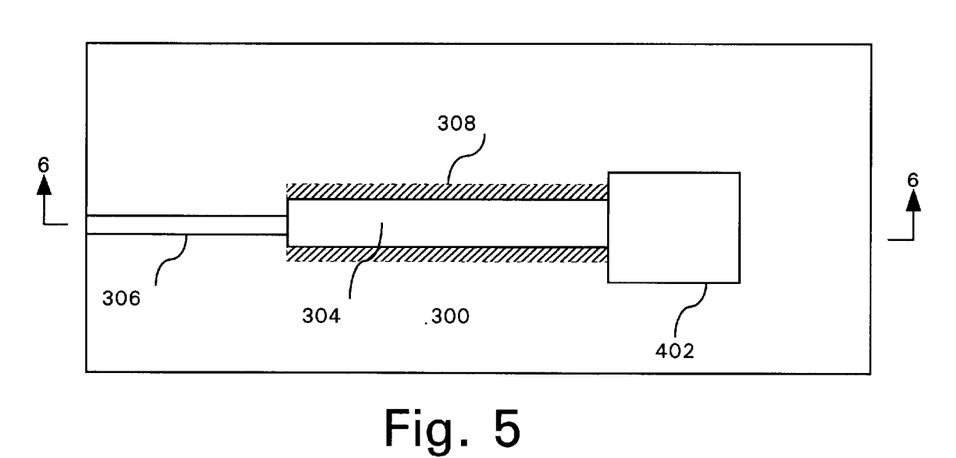
FIG. 5 is a top view of an alternative embodiment of the impedance transformer in FIG. 2.
Figure 6:
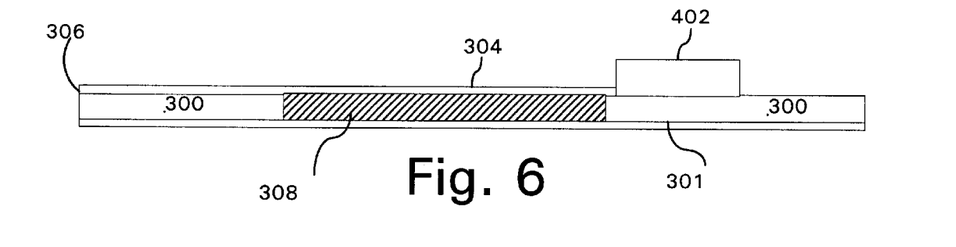
FIG. 6 is a cross-sectional view of FIG. 5 taken along line 6—6.

FIGS. 5 and 6 illustrate an alternative embodiment of the invention in which like reference numerals are used to represent the same structure as previously described in reference to FIGS. 3 and 4. As show in FIGS. 5 and 6, transformer 304 can be used for matching into a device 402. Device 402 can be any circuit to which it is necessary to provide an impedance match.

If the device 402 has exceptionally high impedance or low impedance, it can be practically impossible to create on substrate 300 a quarter-wave transformer section that has the correct characteristic impedance for matching into the device 402. However, by providing a characteristic substrate properties in region 308 that are different from the other portions of substrate 300, then transformer line section 304 can be formed that would be otherwise impossible or at least impractical. These characteristic substrate properties can include a relative permittivity and/or permeability of the substrate.

For example, a higher permittivity in region 308 permits transmission lines that are physically very wide to be reduced to a more manageable width. Likewise, selectively increasing the permeability of region 308 can permit higher impedance lines of practical width to be formed on the substrate when such high impedance values would be otherwise too narrow for practical implementation on substrate 300.

Figure 7:
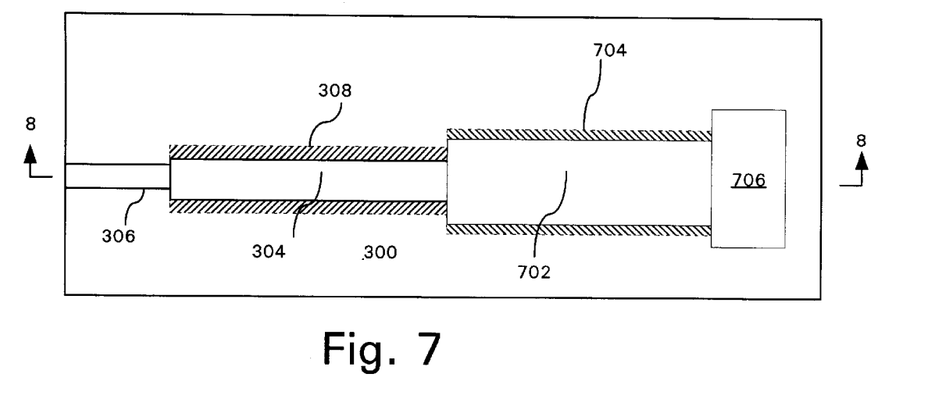
FIG. 7 is a top view of a multi-section impedance transformer that is useful for understanding the invention.
Figure 8:
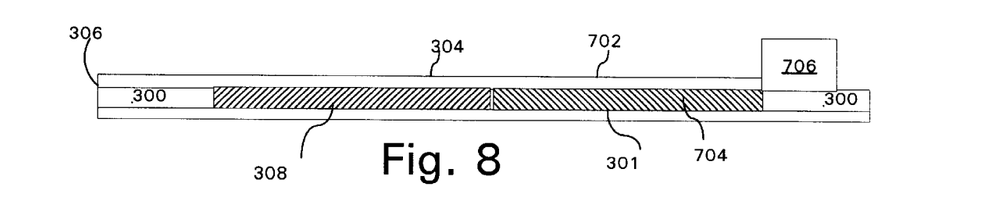
FIG. 8 is a cross-sectional view of FIG. 7 taken along line 8—8.

FIGS. 7 and 8 show a multi-section transformer in which a wide range impedance transformation can be practically achieved over a broader bandwidth than would otherwise be possible with only a single transformer section. In FIGS. 7 and 8, like reference numerals are used to represent the same structure as previously described in reference to FIGS. 3 and 4. A second quarter-wave transformer section 702 is provided in FIGS. 7 and 8 to provide greater operating bandwidth for the transformer. It should be understood, however, that the two transformer sections are merely by way of example and the concepts disclosed herein can be extended to transformers having a greater number of sections.

Referring to FIGS. 7 and 8, the permittivity and permeability of the substrate in regions 308 and 704 can have electrical properties that can be different as compared to each other and with regard to the remainder of the substrate. Accordingly, a designer is provided with substantially greater flexibility with regard to the range of characteristic impedances that can be produced on the substrate 300. Permeability can be increased in regions 308 and/or 704 for achieving practical implementation of transformer sections with higher characteristic impedance than would otherwise be possible on the substrate 300. Permittivity can be increased in regions 308 and/or 704 for achieving practical implementation of transformer sections with lower characteristic impedance than would otherwise be possible on the substrate 300.

Figure 7A:
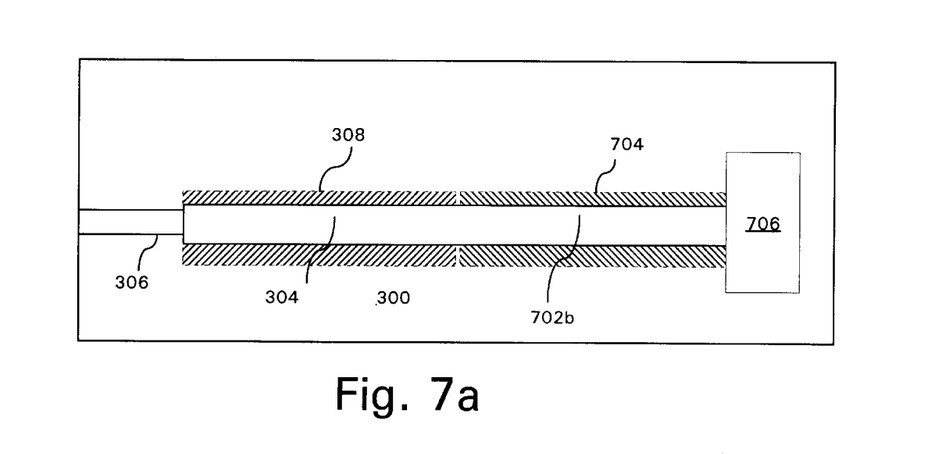
FIG. 7a is a top view of an alternative embodiment of the multi-section impedance transformer in FIG. 7.

In FIGS. 7 and 8, quarter-wave transformer sections 304 and 702 are shown having different widths. It should be noted however that the widths of the transformer sections could be held constant, and the characteristic impedance of each section in that case could be controlled exclusively by selection of the characteristics of the substrate regions 308 and 704 beneath the respective quarter-wave transformer sections. This alternative embodiment is illustrated in FIG. 7a which shows transformer section 702b as having a line width equal to section 304.

The foregoing approach is not limited to use with microstrip constructions as shown in FIGS. 3–8. Rather, it can be used with any other line structure that is formed on a dielectric substrate circuit board. For example, these same techniques can be used for buried microstrip and stripline circuits where selected regions of the dielectric above or below the transmission line have modified permittivity or permeability. Moreover, these techniques are particularly useful in the case of twin line structures such as that shown in FIGS. 9 and 10.

Figure 9:
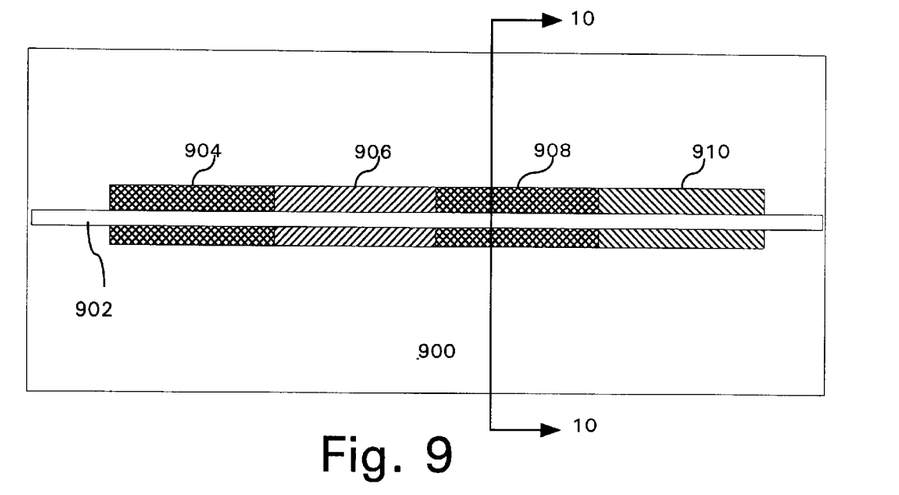
FIG. 9 is a cross-sectional view of a multi-section twin-line impedance transformer that is useful for understanding the invention.
Figure 10:
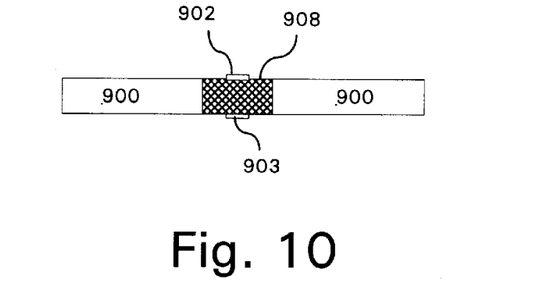
FIG. 10 is a cross-sectional view of the multi-section impedance transformer in FIG. 9 taken along lines 10—10.

FIGS. 9 and 10 multiple section transformer is shown as a twin line structure disposed on a substrate 900. The twin line structure is composed of a pair of elongated conductors 902, 903 on opposing sides of the substrate that together function as a transmission line. The characteristic impedance of the transmission line in FIGS. 9 and 10 is determined by a variety of factors, including the coupling between the elongated conductors 902, 903. The coupling can be affected by the spacing between the lines as well as the characteristics of the substrate. However, it is impractical when using conventional substrate board material to substantially change the thickness of the board to achieve different characteristic impedances for line sections. In FIGS. 9 and 10, this problem is overcome by selecting the characteristics of the substrate in regions 904, 906, 908 and 910 to provide the desired characteristic impedance, without the need to increase the spacing between the lines 902, 903.

Moreover, the substrate regions 904, 906, 908, 910 can be sized in quarter-wave steps at a selected design frequency. Consequently the portions of lines 902, 903 disposed on these substrate regions will define quarter-wave transformer sections, with the characteristic impedance of each section determined by the characteristics of the substrate.

According to a preferred embodiment, the permittivity and/or permeability characteristics of the substrate in each of regions 904, 906, 908, 910 can be chosen independently to achieve a desired line impedance for a particular transformer section. By independently controlling these dielectric properties for each region in this way, a wider range of characteristic line impedances can be practically achieved without the need for altering the thickness of the substrate board 900. For example, increasing the permittivity in a region 904, 906, 908, 910 can permit lines of lower impedance as compared to what could otherwise be achieved using conventional low permittivity substrate. Conversely, increasing the permeability in one or more of these regions can permit lines of higher impedance than that which would otherwise be practically possible on a substrate that is merely a compromise design selection.

Figure 11:
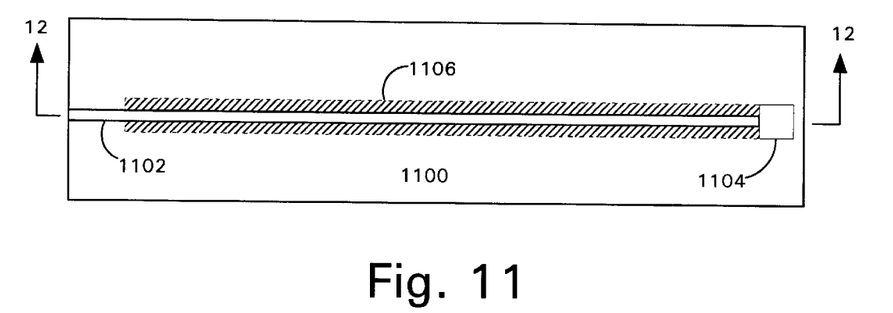
FIG. 11 is a top view of an impedance transformer formed on a substrate region having varying substrate characteristics.
Figure 12:
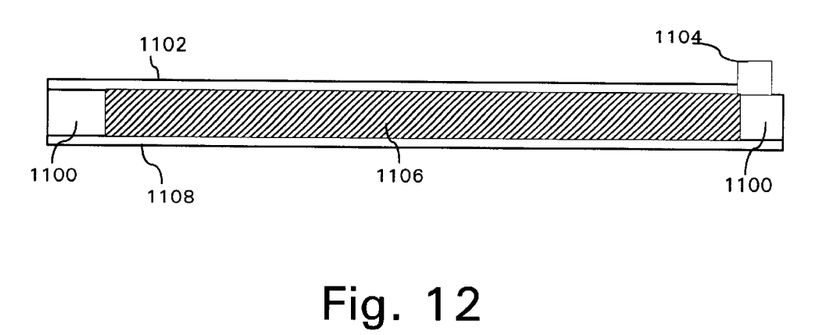
FIG. 12 is a cross-sectional view of the impedance transformer in FIG. 11 taken along lines 12—12.

The impedance transformer in FIGS. 11 and 12 is based on the concept of a conventional tapered line transformer. Basic techniques for designing the overall length and impedance characteristics for tapered line transformers are well know among those skilled in the art. The device in FIGS. 11 and 12 includes a transmission line 1102 formed on a substrate 1100. In this case, the transformer is being used to match into RF device 1104. The transmission line 1102 can be of constant width as shown, or can have a width that varies somewhat over its length. A ground plane 1108 is provided beneath the substrate so as to form a microstrip structure.

Unlike conventional tapered line transformers, the device in FIGS. 11 and 12 does not necessarily vary the line impedance by continuously increasing the line width over the length of the transformer. Instead, the effective permittivity and/or effective permeability can be varied continuously or in a series of small steps within substrate region 1106 so as to gradually change the characteristic impedance over the length of the line 1102.

For example, the substrate in region 1106 can have a permeability of 1 and a permittivity of 10 at a first end, and a permeability of 10 and a permittivity of 1 at an opposing end. The actual values and precise rate at which each of these substrate characteristics can be varied over the length of the substrate region 1106 will depend upon the particular design characteristics of the transformer and the range of impedance characteristics sought to be obtained. These precise values for the permittivity and permeability within each part of region 1106 can be determined experimentally or through the use of computer modeling.

Figure 13:
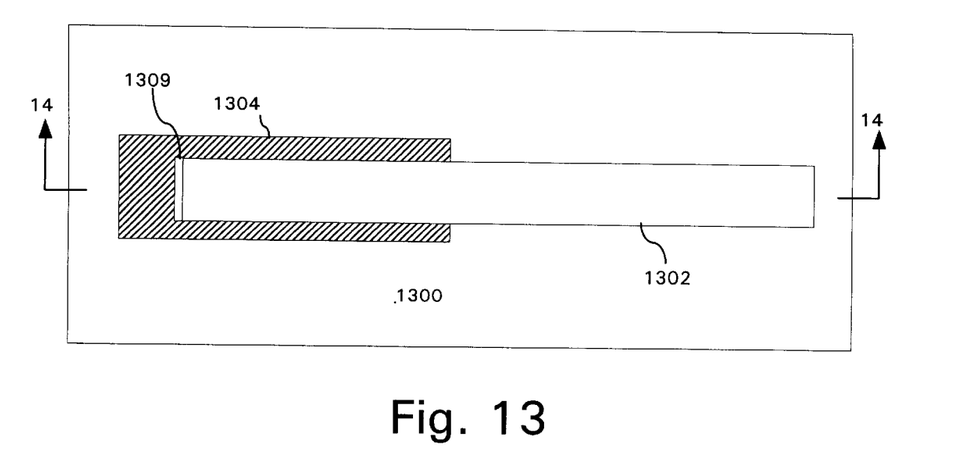
FIG. 13 is a top view of a stacked configuration impedance transformer that is useful for understanding the invention.
Figure 14:
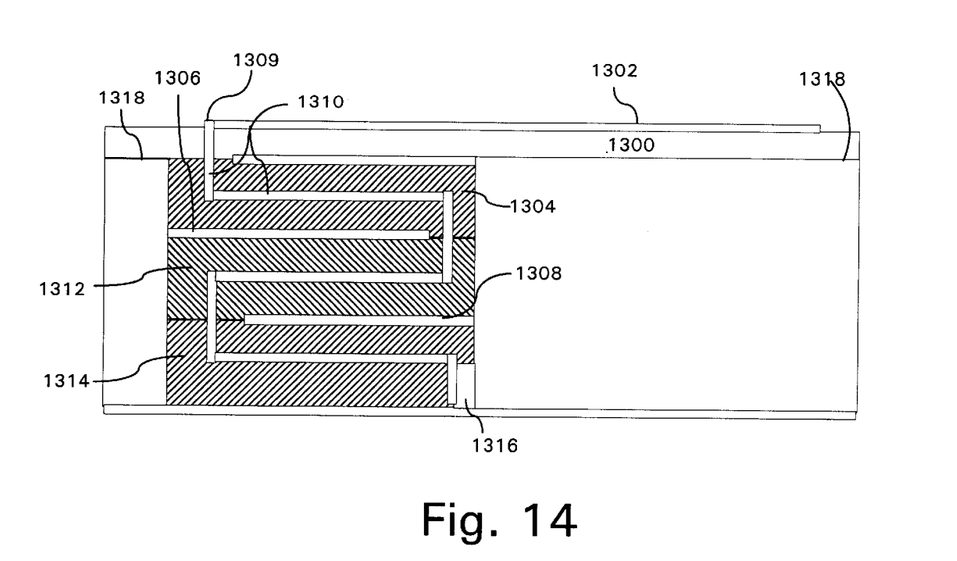
FIG. 14 is a cross-sectional view of the stacked impedance transformer of FIG. 13 taken along lines 14—14.

FIGS. 13 and 14 show an alternative embodiment of a multi-section quarter-wave transformer that uses a combination of stripline and microstrip structures positioned within regions of substrate having different characteristics. The transformer in FIGS. 13 and 14 can comprise a microstrip line 1302 that is disposed on a substrate 1300 above a ground plane 1318. At transition 1309, the conductor forming microstrip line 1302 can descends within the substrate 1300 and becomes essentially a stripline structure 1310. The stripline structure 1310 is bounded above and below by interdigital ground plane fingers 1306 and 1308. The arrangement of this stripline structure is commonly referred to as a stacked configuration. The stacked configuration is useful for reducing the substrate area required to implement a transmission line of relatively long length.

The stripline structure 1310 is preferably comprised of a series of quarter-wave transformer sections. The transformer sections can be provided for establishing a match with a load such as RF device 1316 at an opposing end thereof. As best seen in FIG. 14, the quarter-wave structures are defined as the portion of stripline structure 1310 contained respectively within substrate regions 1304, 1312, and 1314. Although three quarter-wave sections are shown in FIG. 14, it will be appreciated that a greater or lesser number of quarter-wave transformer sections can be used, and the invention is not limited to the precise embodiment shown.

In FIGS. 13 and 14, the impedance of each transformer section is controlled, at least in part, by selection of the substrate characteristics in each of regions 1304, 1312, and 1314. For example a different relative permeability and/or relative permittivity can be selectively chosen for each of these regions to achieve a combination of transformer impedance characteristics that would otherwise be impractical.

Figure 14A:
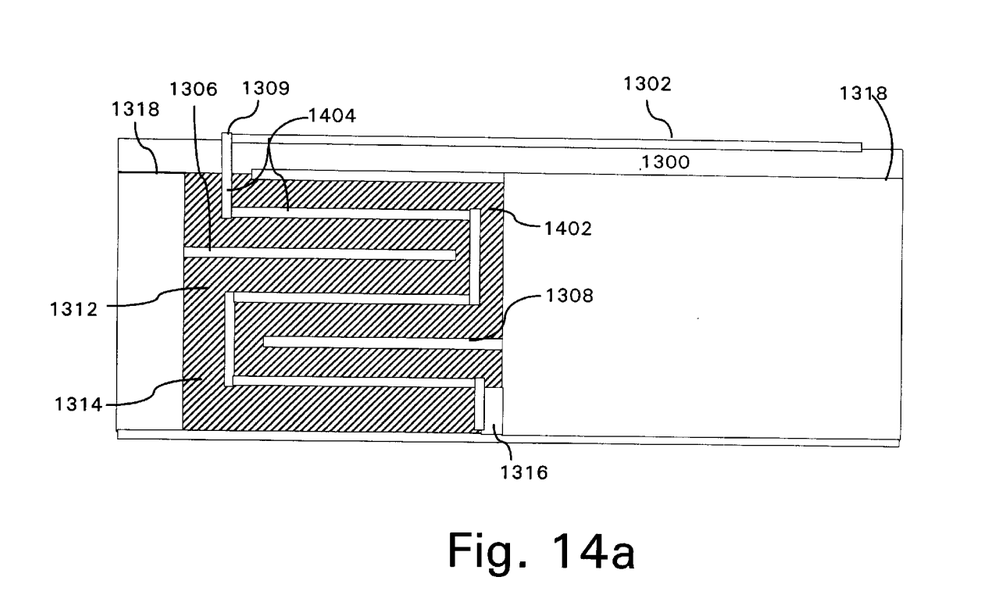
FIG. 14a is a cross-sectional view of an alternative embodiment of the transformer in FIG. 14.

FIG. 14a shows a further alternative embodiment of the invention in which like structure is represented using the same reference numerals as in FIG. 14. The system in FIG. 14a operates on the same theory as a conventional tapered line. However, in FIG. 14a, the impedance of transformer 1404 can be varied by choosing the characteristics of the substrate in region 1402. The characteristics of the substrate can be made to vary continuously or in a series of small steps. For example, in FIG. 14a, the permittivity and permeability can begin as 1 and 10, respectively at an upper part of region 1402, and can gradually transition to 10 and 1, respectively at the lower part of region 1402. Of course, the invention is not limited to any particular range of permittivity and permeability values. Instead, such values and the rate at which they can vary within a region will depend upon the particular design criteria for the transformer. Likewise, the transformer section can be of a continuous line width, or can be made to vary somewhat in accordance with impedance requirements.

Figure 15:
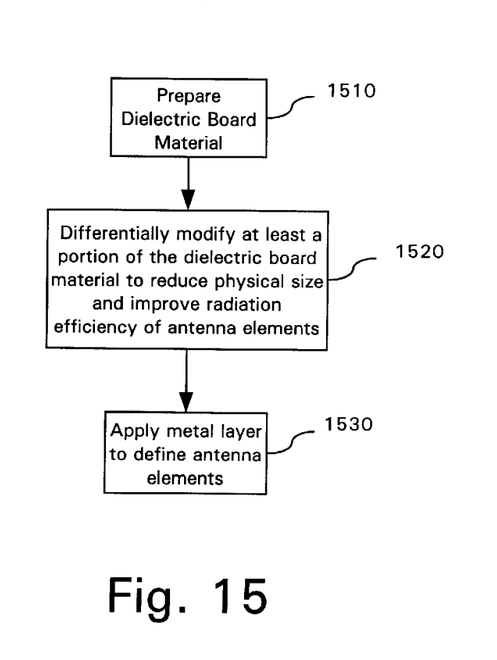
FIG. 15 is a flow chart that is useful for illustrating a process for manufacturing impedance transformers in accordance with the inventive arrangements.

Dielectric substrate boards having metamaterial portions providing localized and selectable magnetic and dielectric properties can be prepared as shown in FIG. 15. In step 1510, the dielectric board material can be prepared. In step 1520, at least a portion of the dielectric board material can be differentially modified using meta-materials, as described below, to reduce the physical size and achieve the best possible efficiency for the transformer. Finally, in step 1530 a metal layer can be applied to define the conductive traces associated with the transformer. This process can be repeated one or more times to build up folded stripline structures as shown in FIGS. 13–15.

As defined herein, the term "metamaterials" refers to composite materials formed from the mixing or arrangement of two or more different materials at a very fine level, such as the Angstrom or nanometer level. Metamaterials allow tailoring of electromagnetic properties of the composite, which can be defined by effective electromagnetic parameters comprising effective electrical permittivity (or dielectric constant) and the effective magnetic permeability The process for preparing and differentially modifying the dielectric board material as described in steps 1510 and 1520 shall now be described in some detail. It should be understood, however, that the methods described herein are merely examples and the invention is not intended to be so limited.

Appropriate bulk dielectric substrate materials can be obtained from commercial materials manufacturers, such as DuPont and Ferro. The unprocessed material, commonly called Green Tape™, can be cut into sized portions from a bulk dielectric tape, such as into 6 inch by 6 inch portions. For example, DuPont Microcircuit Materials provides Green Tape material systems, such as 951 Low-Temperature Cofire Dielectric Tape and Ferro Electronic Materials ULF28-30 Ultra Low Fire COG dielectric formulation. These substrate materials can be used to provide dielectric layers having relatively moderate dielectric constants with accompanying relatively low loss tangents for circuit operation at microwave frequencies once fired.

In the process of creating a microwave circuit using multiple sheets of dielectric substrate material, features such as vias, voids, holes, or cavities can be punched through one or more layers of tape. Voids can be defined using mechanical means (e.g. punch) or directed energy means (e.g., laser drilling, photolithography), but voids can also be defined using any other suitable method. Some vias can reach through the entire thickness of the sized substrate, while some voids can reach only through varying portions of the substrate thickness.

The vias can then be filled with metal or other dielectric or magnetic materials, or mixtures thereof, usually using stencils for precise placement of the backfill materials. The individual layers of tape can be stacked together in a conventional process to produce a complete, multi-layer substrate. Alternatively, individual layers of tape can be stacked together to produce an incomplete, multi-layer substrate generally referred to as a sub-stack.

Voided regions can also remain voids. If backfilled with selected materials, the selected materials preferably include metamaterials. The choice of a metamaterial composition can provide effective dielectric constants over a relatively continuous range from less than 2 to about 2650. Magnetic properties are also available from certain metamaterials. For example, through choice of suitable materials the relative effective magnetic permeability generally can range from about 4 to 116 for most practical RF applications. However, the relative effective magnetic permeability can be as low as about 2 or reach into the thousands.

The term "differentially modified" as used herein refers to modifications, including dopants, to a dielectric substrate that result in at least one of the dielectric and magnetic properties being different at one portion of the substrate as compared to another portion. A differentially modified board substrate preferably includes one or more metamaterial containing regions.

For example, the modification can be selective modification where certain dielectric layer portions are modified to produce a first set of dielectric or magnetic properties, while other dielectric layer portions are modified differentially or left unmodified to provide dielectric and/or magnetic properties different from the first set of properties. Differential modification can be accomplished in a variety of different ways.

According to one embodiment, a supplemental dielectric layer can be added to the dielectric layer. Techniques known in the art such as various spray technologies, spin-on technologies, various deposition technologies or sputtering can be used to apply the supplemental dielectric layer. The supplemental dielectric layer can be selectively added in localized regions, including inside voids or holes, or over the entire existing dielectric layer. For example, a supplemental dielectric layer can be used for providing a substrate portion having an increased effective dielectric constant.

The differential modifying step can further include locally adding additional material to the dielectric layer or supplemental dielectric layer. The addition of material can be used to further control the effective dielectric constant or magnetic properties of the dielectric layer to achieve a given design objective.

The additional material can include a plurality of metallic and/or ceramic particles. Metal particles preferably include iron, tungsten, cobalt, vanadium, manganese, certain rare-earth metals, nickel or niobium particles. The particles are preferably nanometer size particles, generally having submicron physical dimensions, hereafter referred to as nanoparticles.

The particles, such as nanoparticles, can preferably be organofunctionalized composite particles. For example, organofunctionalized composite particles can include particles having metallic cores with electrically insulating coatings or electrically insulating cores with a metallic coating. Magnetic metamaterial particles that are generally suitable for controlling magnetic properties of dielectric layer for a variety of applications described herein include ferrite organoceramics (FexCyHz)—(Ca/Sr/Ba-Ceramic). These particles work well for applications in the frequency range of 8–40 GHz. Alternatively, or in addition thereto, niobium organoceramics (NbCyHz)—(Ca/Sr/Ba-Ceramic) are useful for the frequency range of 12–40 GHz. The materials designated for high frequency are also applicable to low frequency applications. These and other types of composite particles can be obtained commercially.

In general, coated particles are preferable for use with the present invention as they can aid in binding with a polymer (e.g. LCP) matrix or side chain moiety. In addition to controlling the magnetic properties of the dielectric, the added particles can also be used to control the effective permittivity of the material. Using a fill ratio of composite particles from approximately 1 to 70%, it is possible to raise and possibly lower the dielectric constant of substrate layer and/or supplemental substrate layer portions significantly. For example, adding organofunctionalized nanoparticles to a substrate layer can be used to raise the permittivity of the modified substrate layer portions.

Particles can be applied by a variety of techniques including polyblending, mixing and filling with agitation. For example, if the substrate layer includes a LCP, the permittivity may be raised from a nominal LCP value of 2 to as high as 10 by using a variety of particles with a fill ratio of up to about 70%.

Metal oxides useful for this purpose can include aluminum oxide, calcium oxide, magnesium oxide, nickel oxide, zirconium oxide and niobium (II, IV and V) oxide. Lithium niobate ($LiNbO_3$), and zirconates, such as calcium zirconate and magnesium zirconate, also may be used.

The selectable dielectric properties can be localized to areas as small as about 10 nanometers, or cover large area regions, including the entire board substrate surface. Conventional techniques such as lithography and etching along with deposition processing can be used for localized dielectric and magnetic property manipulation.

Materials can be prepared mixed with other materials or including varying densities of voided regions (which generally introduce air) to produce effective dielectric constants in a substantially continuous range from 2 to about 2650, as well as other potentially desired substrate properties. For example, materials exhibiting a low permittivity (<2 to about 4) include silica with varying densities of voided regions. Alumina with varying densities of voided regions can provide a dielectric constant of about 4 to 9. Neither silica nor alumina have any significant magnetic permeability. However, magnetic particles can be added, such as up to 20wt. %, to render these or any other material significantly magnetic. For example, magnetic properties may be tailored with organofunctionality. The impact on permittivity from adding magnetic materials generally results in an increase in the permittivity.

Medium dielectric constant materials have a permittivity generally in the range of 70 to 500+/−10%. As noted above these materials may be mixed with other materials or voids to provide desired effective permittivity. These materials can include ferrite doped calcium titanate. Doping metals can include magnesium, strontium and niobium. These materials have a range of 45 to 600 in relative magnetic permeability.

For high value permittivity applications, ferrite or niobium doped calcium or barium titanate zirconates can be used. These materials have a dielectric constant of about 2200 to 2650. Doping percentages for these materials are generally from about 1 to 10%. As noted with respect to other materials, these materials may be mixed with other materials or voids to provide desired effective permittivity.

These materials can generally be modified through various molecular modification processing. Modification processing can include void creation followed by filling with materials such as carbon and fluorine based organofunctional materials, such as polytetrafluoroethylene PTFE.

Alternatively or in addition to organofunctional integration, processing can include solid freeform fabrication (SFF), photo, uv, x-ray, e-beam or ion-beam irradiation. Lithography can also be performed using photo, uv, x-ray, e-beam or ion-beam radiation.

Different materials, including metamaterials, can be applied to different areas on substrate layers (sub-stacks), so that a plurality of areas of the substrate layers (sub-stacks) have different dielectric and/or magnetic properties. The backfill materials, such as noted above, may be used in conjunction with one or more additional processing steps to attain desired, dielectric and/or magnetic properties, either locally or over a bulk substrate portion.

A top layer conductor print is then generally applied to the modified substrate layer, sub-stack, or complete stack. Conductor traces can be provided using thin film techniques, thick film techniques, electroplating or any other suitable technique. The processes used to define the conductor pattern include, but are not limited to standard lithography and stencil.

A base plate is then generally obtained for collating and aligning a plurality of modified board substrates. Alignment holes through each of the plurality of substrate boards can be used for this purpose.

The plurality of layers of substrate, one or more sub-stacks, or combination of layers and sub-stacks can then be laminated (e.g. mechanically pressed) together using either isostatic pressure, which puts pressure on the material from all directions, or uniaxial pressure, which puts pressure on the material from only one direction. The laminate substrate is then further processed as described above or placed into an oven to be fired to a temperature suitable for the processed substrate (approximately 850 C to 900 C for the materials cited above).

The plurality of ceramic tape layers and stacked sub-stacks of substrates can then be fired, using a suitable furnace that can be controlled to rise in temperature at a rate suitable for the substrate materials used. The process conditions used, such as the rate of increase in temperature, final temperature, cool down profile, and any necessary holds, are selected mindful of the substrate material and any material backfilled therein or deposited thereon. Following firing, stacked substrate boards, typically, are inspected for flaws using an optical microscope.

The stacked ceramic substrates can then be optionally diced into cingulated pieces as small as required to meet circuit functional requirements. Following final inspection, the cingulated substrate pieces can then be mounted to a test fixture for evaluation of their various characteristics, such as to assure that the dielectric, magnetic and/or electrical characteristics are within specified limits.

Thus, substrate materials can be provided with localized dielectric and/or magnetic characteristics for improving the density and performance of circuits. The dielectric flexibility allows independent optimization of the circuit elements.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

What is claimed is:

1. An impedance transforming device, comprising:
   a dielectric circuit board substrate having at least one region defining a portion of said substrate that has at least one of a relative permeability and a relative permittivity different from a remaining portion of said substrate;
   a transmission line transformer disposed on said substrate and coupled to said at least one region, said transmission line transformer configured for matching an input circuit of said transformer to an output circuit of said transformer.

2. The impedance transforming device according to claim 1 wherein said transmission line transformer is at least one of a microstrip construction, a stripline construction and a twin-line construction.

3. The impedance transforming device according to claim 1 further comprising:
   a plurality of said regions, each having at least one of said relative permeability and said relative permittivity different from remaining ones of said regions and wherein said transmission line transformer comprises a plurality of segments, each said segment coupled to at least one of said regions.

4. The impedance transforming device according to claim 1 wherein transmission line transformer is a multiple of a quarter-wavelength at a predetermined operating frequency of said device.

5. The impedance transforming device according to claim 1 wherein at least one of said permittivity and said permeability is varied within said region along a length of said transmission line transformer.

6. The impedance transforming device according to claim 5 wherein a characteristic impedance of said transmission line transformer varies along its length in accordance with a tapered line type transformer.

7. The impedance transforming device according to claim 1 wherein at least a portion of said transmission line transformer is constructed in a stacked configuration.

8. The impedance transforming device according to claim 7 further comprising a plurality of said regions, each having at least one of said relative permeability and said relative permittivity different from remaining ones of said regions and wherein said transmission line transformer comprises a plurality of segments, each said segment coupled to at least one of said regions.

9. The impedance transforming device according to claim 8 wherein each of said segments is a quarter-wavelength at a pre-determined design frequency.

10. The impedance transforming device according to claim 7 wherein at least one of said permittivity and said permeability is varied within said region along a length of said transmission line transformer.

11. The impedance transforming device according to claim 1 wherein a characteristic impedance of said transmission line transformer along its length varies in accordance with a tapered line type transformer.

12. The impedance transforming device according to claim 1 wherein said substrate comprises meta-materials.

13. An impedance transformer, comprising:
    a transmission line section disposed on a dielectric substrate board, said substrate board having a plurality of regions, each said region having a combination of relative permeability and relative permittivity different from at least one other region of said substrate;
    at least one transmission line transformer disposed on said substrate board, at least a portion of said transmission line transformer disposed on at least one of said regions of said substrate; and
    wherein said transmission line transformer is at least one of a stripline construction, a microstrip construction, and a twin-line construction.

14. The impedance transformer according to claim 13 wherein said transmission line transformer comprises at least two sections, each section comprising a multiple of a quarter-wave at a pre-determined operating frequency.

15. The impedance transformer according to claim 14 wherein each said section is coupled respectively to a different one of said plurality of regions.

16. The impedance transformer according to claim 13 wherein a characteristic impedance of said transmission line transformer is at least partially determined by a gradation of at least one said relative permittivity and said relative permeability along a length of said transmission line transformer.

17. The impedance transformer according to claim 16 wherein said gradation is continuously varying along at least a portion of said length.

* * * * *